US006809965B2

(12) United States Patent
Rosendale

(10) Patent No.: US 6,809,965 B2
(45) Date of Patent: Oct. 26, 2004

(54) CONTROL CIRCUITRY FOR A NON-VOLATILE MEMORY

(75) Inventor: Glen Arnold Rosendale, Palo Alto, CA (US)

(73) Assignee: Virtual Silicon Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/247,767

(22) Filed: Sep. 18, 2002

(65) Prior Publication Data

US 2003/0072188 A1 Apr. 17, 2003

Related U.S. Application Data

(60) Provisional application No. 60/323,612, filed on Sep. 19, 2001.

(51) Int. Cl.[7] .............................................. G11C 16/04
(52) U.S. Cl. .............................. 365/185.18; 365/189.02
(58) Field of Search .................... 365/185.18, 189.02, 365/189.09, 226

(56) References Cited

U.S. PATENT DOCUMENTS

| 5,187,683 | A | * | 2/1993 | Gill et al. | 365/185.06 |
| 5,341,329 | A | * | 8/1994 | Takebuchi | 365/185.3 |
| 5,557,572 | A | | 9/1996 | Sawada et al. | 365/189.07 |
| 5,896,316 | A | * | 4/1999 | Toyoda | 365/185.02 |
| 6,314,025 | B1 | * | 11/2001 | Wong | 365/185.22 |

* cited by examiner

Primary Examiner—VanThu Nguyen
(74) Attorney, Agent, or Firm—Sierra Patent Group, Ltd.

(57) ABSTRACT

Control circuitry for applying voltages to a memory circuit. In accordance with this invention, row circuitry applies either a high voltage or a low voltage to a memory cell based on the operation to be performed and column circuitry applies a high or a low voltage to the memory cell based on the operation to be performed.

59 Claims, 7 Drawing Sheets

US 6,809,965 B2

CONTROL CIRCUITRY FOR A NON-VOLATILE MEMORY

CROSS-RELATED

Figure 1:
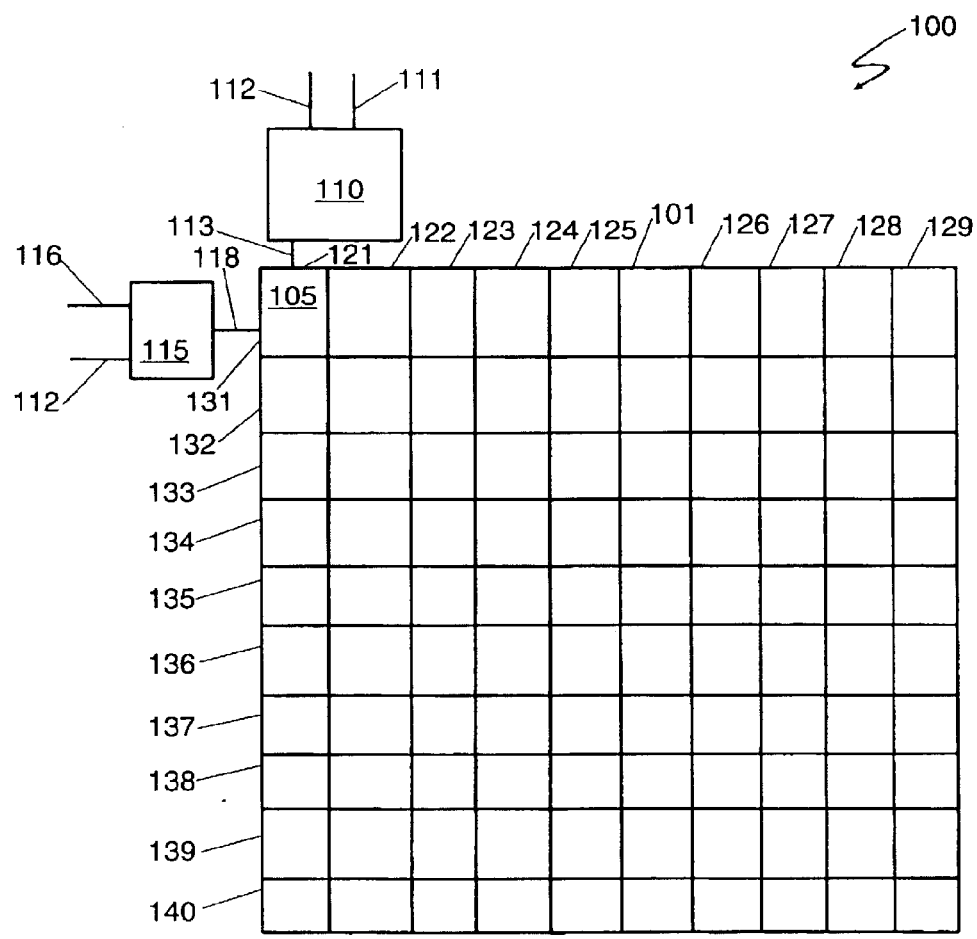

This application is a utility application claiming priority to an earlier filed U.S. Provisional Application No. 60/323,612 filed Sep. 19, 2001.

BACKGROUND OF THE INVENTION

1. Field of the Invention

This invention relates to a non-volatile memory. More particularly, this invention relates to a control circuitry to a non-volatile memory. Still more particularly, this invention relates to control circuitry that applies varying voltages to terminals of a memory cell.

2. The Prior Art

Non-volatile memories are common in most processing systems. A non-volatile memory is a memory made of individual memory cells that are commonly transistors. The memory cells in the memory are arranged in rows and columns.

Operations such as read, write and erase, are performed on the memory cells are performed by applying specified voltages to terminals of the individual cells. Typically, a row latch is used to apply a voltage to one terminal of individual memory cells in a specified row to perform an operation and a column latch is used to apply a second voltage to a second terminal of the individual memory cells in a specified column to perform the operation. The row latch commonly applies voltages to the gate of the transistor in the individual memory cells. The column latch commonly applies voltages to the drain of the transistor of the individual memory cells in a column.

Typically, the voltages applied to the terminals by the column latch and row latch are generated by circuitry in the memory system. As non-volatile memories get smaller, the requirements for the voltages applied to the terminal of individual memory cells become more complex. For example, some operations may require successive or simultaneous application of differing potential to the terminals of identical memory elements. Therefore, there is a need in the art for circuitry that provides these different voltages in a timely and consistent manner.

BRIEF DESCRIPTION OF THE INVENTION

The above and other problems are solved and an advance in the art is made by the control circuitry of non-volatile memory in accordance with this invention. In accordance with this invention, the control circuitry of a memory may apply simultaneously differing voltages to multiple individual memory cells. Control circuitry, designed in accordance with this invention, is made economical through the minimal use of transistors in the circuit to control the voltages.

In accordance with this invention, the control circuitry has a first or row circuitry that is configured to provide one of a first group of voltages to an individual memory based upon the row of the memory cell and the operation to be performed. The control circuitry also has second or column circuitry that applies a second voltage from a second group of voltages to the memory cell based upon the column of the cell and the operation to be performed.

In accordance with this invention, the first circuitry of the control circuitry may in row latch circuitry. The row latch circuitry has a first input that receives a high voltage and a second input that receives a low voltage. The row latch circuitry then selects either the high voltage or the low voltage to apply to the memory cell. An output of the row latch circuitry then applies the selected voltage to the memory cell.

A high voltage multiplexer may have an output connected to the row latch circuitry. The high voltage multiplexer has inputs that each receives one of a group of high voltages and an output that applies one of the received high voltages to the row latch circuitry.

A low voltage multiplexer may also have an output connected to the row latch circuit to provide the low voltage. The low voltage multiplexer inputs each receives one of a group of low voltages. A low voltage from the group is then selected and an output applies the selected low voltage to the row latch circuitry.

Selection circuitry may also be connected to the row latch circuitry. The selection circuitry applies a control signal to the row latch circuitry. The row latch circuitry determines which of the voltages to apply to the memory cell based upon the control signal. The selection circuitry may include a signal line, an inverter connected to the signal line, and a word line multiplexer that has inputs connected to the signal line and the inverter. The word line multiplexer selectively applies either the signal or an inverted signal to the row latch circuitry.

In accordance with this invention, the second circuit may include column latch circuitry. The column latch circuitry may include a first input that receives a high voltage and a second input that receives a low voltage. The circuitry then selects one of the voltages. An output of the column latch circuitry applies the selected voltage to the memory element.

The second circuitry may also include word latch circuitry. The word latch circuitry has inputs that each receives one of a group of high voltages. The word latch circuitry selects one of the received high voltages and an output of the word latch circuitry applies the selected high voltage to the column latch circuitry.

A first input of the word latch circuitry may be connected to an output of a first multiplexer. The first multiplexer receives at least two of high voltage signals outputs one of the received high voltages. A second input of the word latch circuitry may be connected to an output of a second multiplexer. The second multiplexer receives two more high voltage signals and outputs one of the high voltages to an input of the word latch circuitry.

The low voltage for the column latch circuitry may be received from a low voltage multiplexer. The low voltage multiplexer receives a group of low voltage signals and outputs one of the low voltage signals to said column latch circuitry.

BRIEF DESCRIPTION OF THE DRAWING FIGURES

Figure 2:
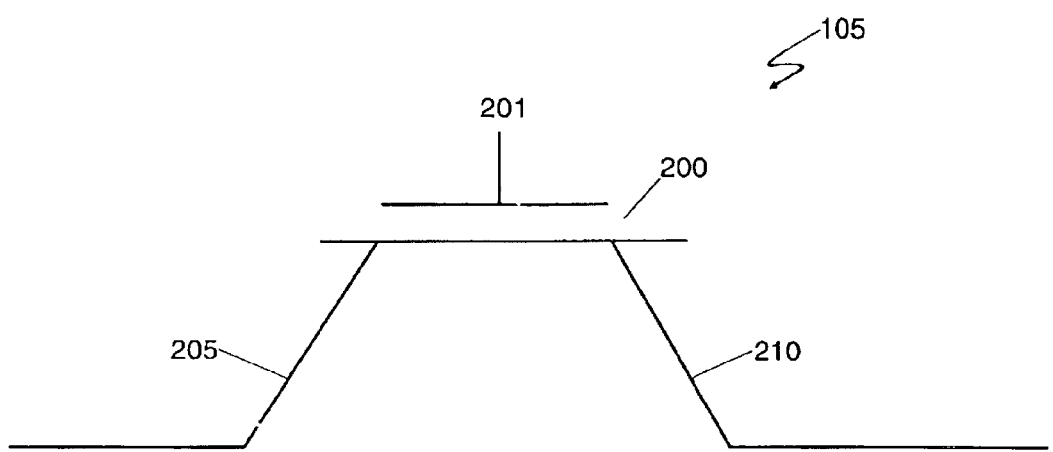
Figure 3:
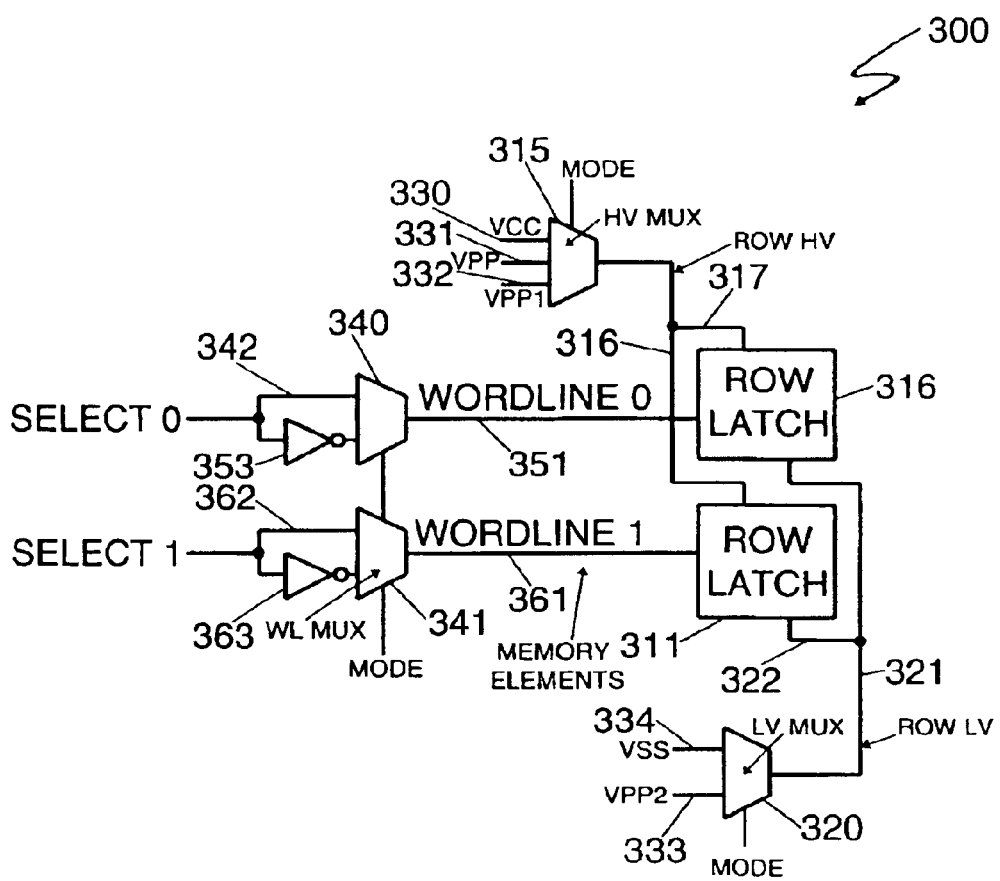
Figure 4:
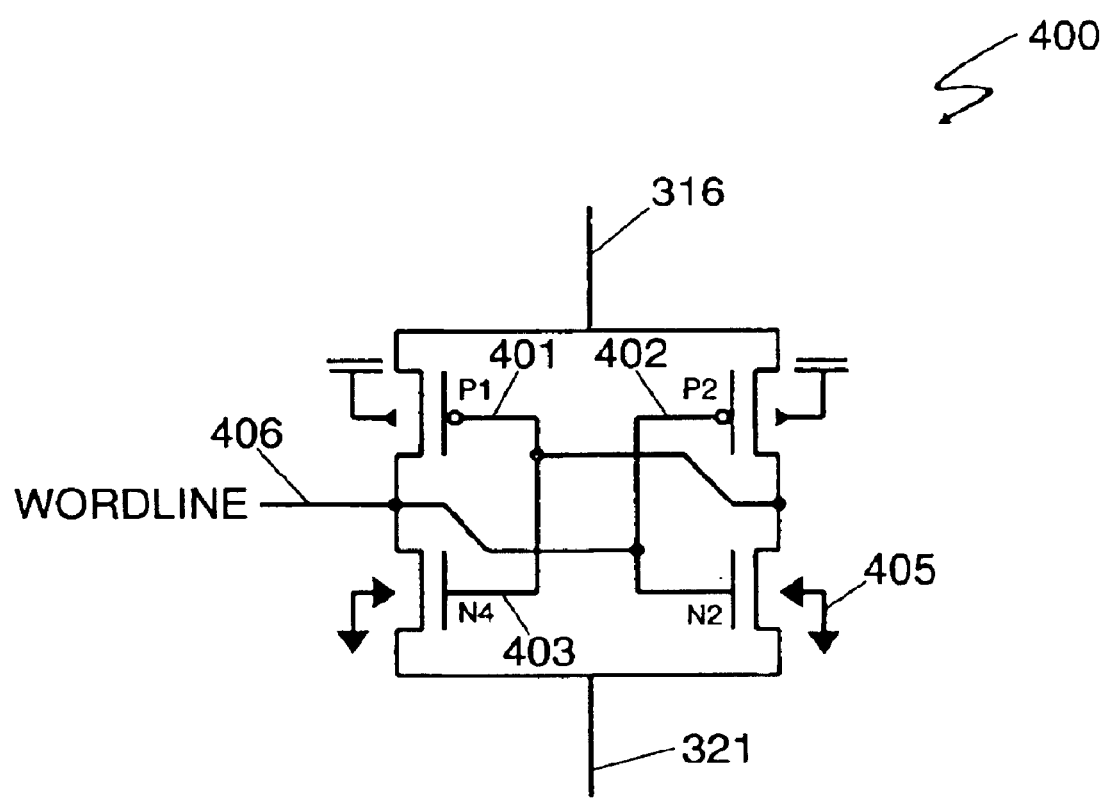
Figure 5:
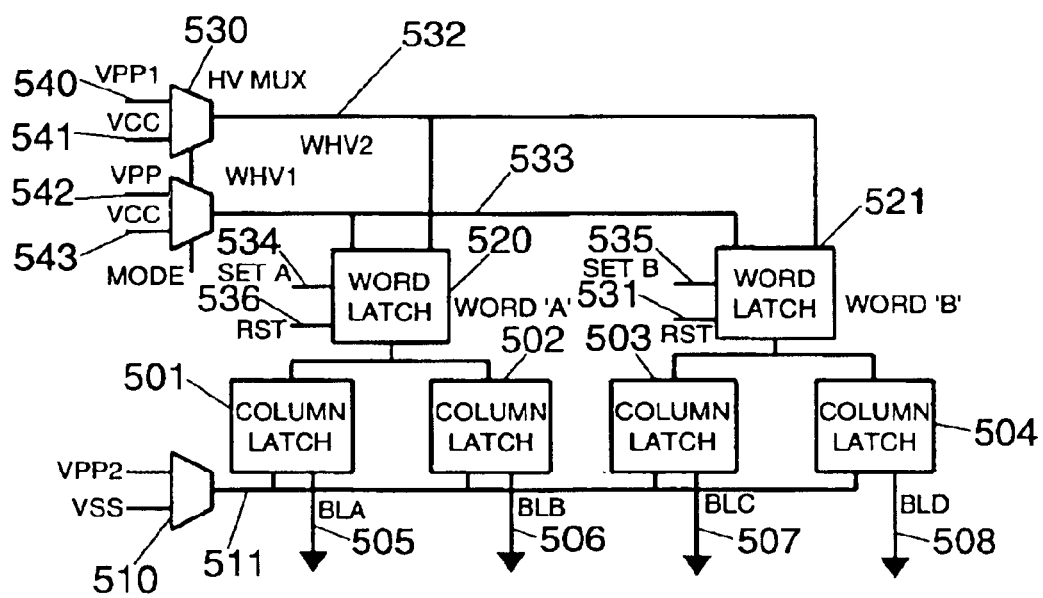
Figure 6:
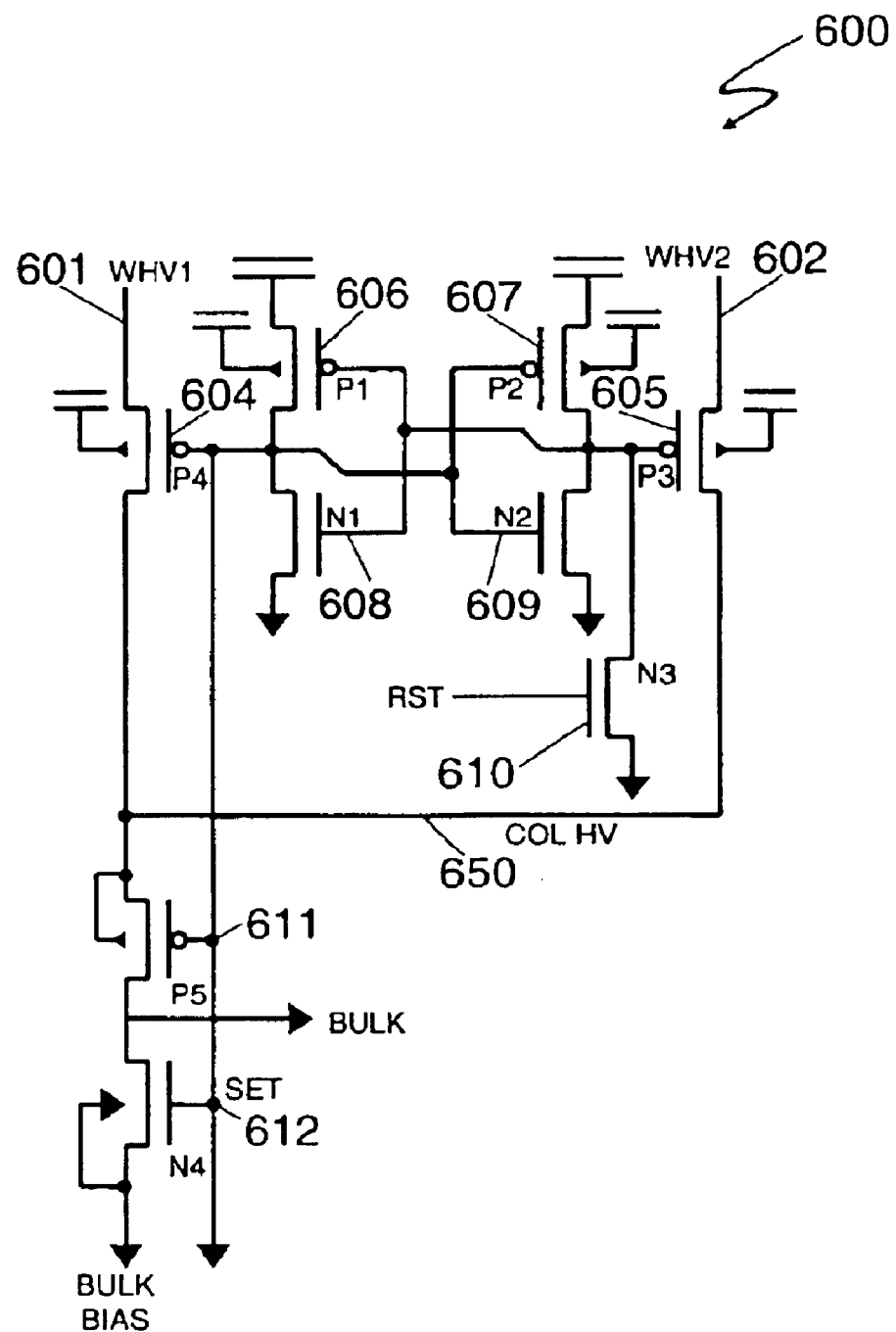
Figure 7:
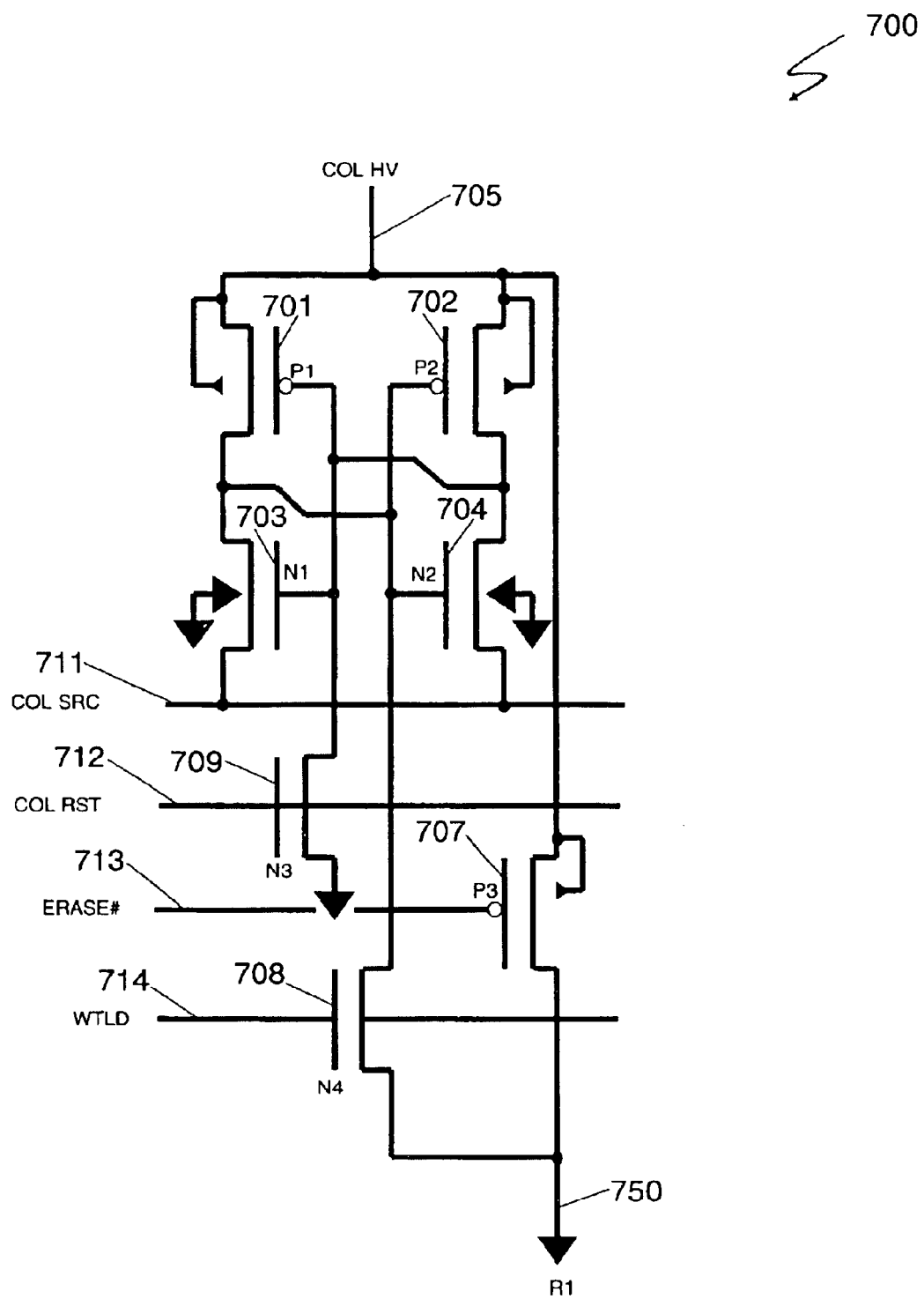

The above and other features and advantages of this invention are taught in the Detailed Description of this invention and the following drawings:

FIG. 1 illustrating a block diagram of a memory system in accordance with this invention;

FIG. 2 illustrating a block diagram of an individual memory cell in accordance with this invention;

FIG. 3 illustrating a block diagram of circuitry for providing a voltage to a row latch in accordance with this invention;

FIG. 4 illustrating a block diagram of a row latch in accordance with this invention;

FIG. 5 illustrating a block diagram of circuitry for providing a voltage to a column latch in accordance with this invention;

FIG. 6 illustrating a block diagram of a column latch in accordance with this invention; and FIG. 7 illustrating a block diagram for providing a word latch in accordance with this invention.

DETAILED DESCRIPTION

Persons of ordinary skill in the art will realize that the following description of the present invention is illustrative only and not in any way limiting. Other embodiments of the invention will readily suggest themselves to such skilled persons having the benefit of this disclosure.

FIG. 1 illustrates a non-volatile memory 100 that incorporates the control circuitry of this invention. Non-volatile memory 100 includes an array 101 of memory cells 105. Memory cells 105 are arranged in columns 121–129 and rows 131–140. Each memory element in column 121 is connected to column latch circuitry 110. One skilled in the art that the memory cells in the remaining columns are also connected to column latch circuitry that is configured in the same manner as circuitry 110 for the column. However, the connections of the remaining columns are omitted for brevity. Each memory element 105 in row 131 is connected to row latch circuitry 115. Those skilled in the art will recognize that the memory elements 132–140 are also connected to row latch circuitry. These cells are connected in the same manner as row 131. However, the description of each is omitted for clarity and brevity.

Column latch circuitry 110 receives a high voltage over path 111 and a low voltage over path 112. Column latch circuitry 110 then applies either the high voltage or the low voltage to the memory cells 105 in the column via path 113 depending upon the operation that the memory cells in the column are to perform. An exemplary embodiment of this circuitry is described below.

Row latch circuitry 115 receives a high voltage over path 116 and a low voltage over path 117. Row latch circuitry 115 then applies one of the received voltages to the memory cells 105 in row 131 based upon the operation to be performed. An exemplary embodiment of this circuitry is given below.

FIG. 2 illustrates an exemplary embodiment of memory cell 105. Memory cell 105 includes transistor 200. Gate 201 of transistor 200 is connected to the output 118 of the row latch circuitry 115 (FIG. 1), which may also be referred to as the word line. Source 205 of transistor 200 is connected to a signal source (Not shown). Drain 210 of transistor 200 is connected to output 113 of the column latch circuitry 110 for the column of memory cell 105, which also may be referred to as the bit line.

In order to perform various operations of a memory system. Various potentials or voltage must be applied to the memory cells of the array. In accordance with an exemplary embodiment of this invention, the operations that each memory cell 105 may perform include read, load, erase, and write. The potentials applied to the memory cells to provide these operations include VPP, VPP1, VPP2, VREAD, VSS, and VCC. In this exemplary embodiment, the nominal potential of each of the identified potential is given in the table below.

| Potential | Nominal value in Volts |
|---|---|
| VSS | 0 |
| VCC | 2.5 |
| VPP | 15 |
| VPP1 | 10 |
| VPP2 | 5 |
| VREAD | 1.5 |

FIG. 3 illustrates circuitry 300 that includes a row latch circuitry 115 that provides a voltage to a row 131 of memory cells 105 to perform an operation. Circuitry 300 is a series of multiplexers that enable application of a specified voltage to memory cells of a row to perform an operation.

Circuitry 300 includes first row latch circuitry 310 and second row latch circuitry 311. Each of the row latch circuits provides potential to memory cells in one row 131–140 of memory cells. The configuration of exemplary row latch circuitry is given below in FIG. 4.

High voltage multiplexer 315 has inputs for a group of high voltage signals via path 330–332. In this exemplary embodiment, VCC is received via path 330, VPP is received over path 331, and VPP1 is received over path 332. The output of high voltage multiplexer 315 is connected to path 316. An input of second latch circuitry is connected to path 116. An input of first latch circuitry is connected to path 316 via path 317.

Low voltage multiplexer 320 has inputs that receive a first low voltage over pat 334 and a second low voltage over path 335. In the exemplary embodiment, VSS is received over path 334 and VPP2 is received over path 333. Multiplexer 320 selects one of the received voltages to apply to path 321 connected to the out put of multiplexer 320. First latch circuitry 310 has an input connected to path 321 to receive the low voltage from multiplexer 320. An input of second latch circuitry 311 is connected to path 321 via path 322.

In order to determine the proper voltage to apply to the memory cells of a row, first row latch circuitry 310 and second row latch circuitry 311 are both connected to control circuitry via paths 351 and 361. The control circuitry for first row latch circuitry 320 includes a multiplexer 340. Multiplexer 340 provides low voltage isolation. An input of multiplexer 340 is connected to path 352, which applies a control signal to multiplexer 340. A second input of multiplexer 340 is connected to an inverter 353. Inverter 353 is connected to a path 352 and provides an inverse control signal to multiplexer 340. The control circuitry for second row latch circuitry 311 includes a multiplexer 341. Multiplexer 341 provides low voltage isolation. An input of multiplexer 341 is connected to path 362, which applies a control signal to multiplexer 341. A second input of multiplexer 341 is connected to an inverter 363. Inverter 363 is connected to a path 362 and provides an inverse control signal to multiplexer 341.

Row latch circuitry 310 and 311 can be in one of three states: Set, Clear, or Tri-state. The row latch is selected, meaning the control signal is being applied by multiplexer 340,341, the high voltage received over path 316 is applied by row latch circuitry to the memory cells of the row. When the row latch circuitry is deselected, meaning multiplexer 340,341 is applying the inverse control signal, the low voltage from path 321 is applied to the memory cells of the row connected to the row latch circuitry. The following table provides operation performed and the voltage provided for a selected row and a deselected row. One skilled in the art will recognize that the appropriate signals must be provided to multiplexers 315, 320, 340 and 341 to provide these voltages.

| Operation | Selected row latch circuitry output | Deselected row latch circuitry output |
| --- | --- | --- |
| Read | VCC | VSS |
| Load | VSS | VSS |
| Erase | VSS | VPP1 |
| Write | VPP | VPP2 |

FIG. 4 illustrates an exemplary embodiment of row latch circuitry 400. The sources of PMOS transistors 401 and 402 are connected to high voltage input 316 in parallel. The sources of NMOS transistors are connected in parallel to low voltage source path 321. The drains of first PMOS transistor 401 and first NMOS transistor 404 are connected to an output 406 and to the gates of second PMOS transistor 402 and second NMOS transistor 405.

The drains of second PMOS transistor 402 and second NMOS transistor 405 are connected to each other and to the gates of first PMOS transistor 401 and first NMOS transistor 404. The bulk voltage of PMOS transistors 401 and 402 are held at VCC and the bulk voltage of NMOS transistors 404 and 405 are held at VSS. One skilled in the art will recognize that other configurations of row latch circuitry 400 may be used in accordance with this invention and row latch circuitry 400 is only given as an exemplary embodiment.

FIG. 5 illustrates a diagram of the control circuitry 500 that provides voltages to specified columns for performing operations. Each column latch circuit 501–504 is connected to the memory cells in an associated column via a path 505–508. Each column circuit 501–505 has a low voltage input which is connected to low voltage multiplexer 510 via path 511. The column latch circuits receive one of the low voltages applied to multiplexer 510 via path 512 and 513. Each column circuit 501–504 also has high voltage input connected to an associated word latch circuit 520,521 for the word line associated with the column. For example, column latch circuits 501 and 502 are connected to word latch circuit 520 and column latch circuits 503 and 504 are connected to word latch circuit 521. One skilled in the art will recognize that any number of column latch circuits may be connected to a word latch circuit depending on the number of memory cells that are included in a word. Each word latch circuit is connected to an output of first high voltage multiplexer 530 via path 532 and an output of a second high voltage multiplexer 531 via path 533.

Each word latch circuit 520 and 521 has an input for receiving a set signal 534, 535 and an input for receiving a reset signal 536,537. The set and reset signals are used by word latch circuits 520 and 521 to determine which received high voltage to apply to connected column latch circuits. When a reset signal is received, the voltage received via path 532 is applied to the connected column latch circuits. When a set signal is applied to the word latch circuit, the voltage received via path 533 is applied.

The following table provides the voltages applied on a word latch depending upon whether a set signal is received.

| Operation | Selected | De-selected |
| --- | --- | --- |
| Read | VCC | VCC |
| Load | VCC | VCC |
| Erase | VPP | VPP1 |
| Write | VSS | VPP2 |

First high voltage multiplexer 530 receives high voltage signals via paths 540 and 541. In the exemplary embodiment, VPP1 is received via path 540 and VCC via path 541. The high voltage multiplexer then selects one of the received voltage signals and applies the selected voltage signal to path 532.

Second high voltage multiplexer 531 receives high voltage signals via paths 542 and 543. In the exemplary embodiment, VPP is received via path 542 and VCC via path 543. The high voltage multiplexer 531 then selects one of the received voltage signals and applies the selected voltage signal to path 533.

The pair of a word latch circuit 520 and column latch 501 provides potential to the memory cells in the columns based upon the operation being performed. The column latch circuit provides the high voltage generated by the word latch and provides a low voltage generated in the column circuit to each selected memory element. The following table shows the voltages applied to the memory elements based upon the receiving a select or deselect signal for a bit line in a column latch circuit.

| Operation | Select received | De-select received |
| --- | --- | --- |
| Read | VREAD | VREAD |
| Load | VSS | VCC |
| Erase | VPP | VPP1 |
| Write | VSS | VPP2 |

FIG. 6 illustrates a diagram of a word latch circuit 600 that is used as a word latch circuit in accordance with this invention. In Word latch circuit 600, path 601 from the first high voltage multiplexor is connected to a drain of a PMOS transistor 604. The source of transistor 604 is connected to a drain of PMOS transistor 611 and output line 650. The gate of PMOS transistor 604 is connected to the source of PMOS transistor 606, the source of NMOS transistor 608, the gate of NMOS transistor 609 and the gate of NMOS transistor 607.

Path 602 connecting word latch circuit 600 to a second high voltage multiplexer is connected to a source of PMOS transistor 605. The drain of MOS transistor 605 is connected to output line 650. The gate of PMOS transistor 605 is connected to a source of NMOS transistor 610, a gate of PMOS transistor 606, the gate of NMOS transistor 608, the drain of PMOS transistor 607 and the source of NMOS transistor 609.

PMOS transistor 606 has a drain connected to a VCC source. The source of PMOS transistor 606 is connected to the drain of NMOS transistor 608, and the gates of PMOS transistor 604, PMOS transistor 607, and NMOS transistor 609. The gate of PMOS transistor 606 connected to the drain of PMOS transistor 607, the source of NMOS transistor 609, the gate of NMOS transistor 608 and the gate of PMOS transistor 605.

PMOS transistor 607 has a source connected to a VCC source. The drain of transistor 607 is connected to the source of NMOS transistor 609 and the gates PMOS transistor 605, PMOS transistor 606 and NMOS transistor 608. The gate of PMOS transistor 607 is connected the gates of PMOS transistor 604 and NMOS transistor 609, source of PMOS transistor 606, and the drain of NMOS transistor 608.

NMOS transistor 608 has a source connected to a VSS source. The drain of NMOS transistor 608 is connected to the source of PMOS transistor 606, and the gates of PMOS transistor 604, PMOS transistor607, and NMOS transistor 609. The gate of NMOS transistor 608 connected to the drain of PMOS transistor 607, the source of NMOS transistor 609, and the gates of PMOS transistors 605 and 606.

NMOS transistor 609 has a drain connected to a VSS source. The source of transistor 609 is connected to the drain of PMOS transistor 607 and the gates PMOS transistor 605, PMOS transistor 606 and NMOS transistor 608. The gate of NMOS transistor 609 is connected the gates of PMOS transistors 604, 606 and NMOS transistor 609, the source of PMOS transistor 606, and the drain of NMOS transistor 608.

NMOS transistor 610 has a gate connected to a reset line. The drain of NMOS transistor 610 is connected to a VSS source. The source of NMOS transistor 610 is connected to the drain of PMOS transistor 606, the source of NMOS transistor 609, and the gates of PMOS transistor 605, PMOS transistor 606, and NMOS transistor 608.

The drain of PMOS transistor 611 is connected to output line 650 and the source of PMOS transistor 604. The source PMOS transistor 61 is connected to a drain of NMOS transistor 612 and a BULK line. The gate of PMOS transistor is connected between ground and the gates of PMOS transistor 604, PMOS transistor 607 and NMOS transistor 609.

The source of NMOS transistor 612 is connected to ground. The drain of NMOS transistor 612 is connected to the BULK line and the source of PMOS transistor 611. The gate of NMOS transistor 611 is connected between ground and the gates of PMOS transistor 604, PMOS transistor 607 and NMOS transistor 609. One skilled in the art will recognize that the above description of word latch circuit 600 is one exemplary embodiment and other embodiments may be used that incorporate other configurations of any types of transistors.

FIG. 7 illustrates an exemplary column latch circuit 700. Column latch circuit 700 has a PMOS transistor 701. The drain of PMOS transistor 701 is connected to an input line 705 that is from a word latch circuit. The drain of PMOS 701 is also connected to the source of PMOS transistor 702 and the source of PMOS transistor 707. The source of PMOS transistor 701 is connected to the drain of NMOS transistor 703, the gate of PMOS transistor 702, the gate of NMOS transistor 704 and the source of NMOS transistor 708. The gate of PMOS transistor 701 is connected to the gate of NMOS transistor 703, the drain of PMOS transistor 702, the source of NMOS transistor 704, and the source of NMOS transistor 709.

PMOS transistor 702 has a source connected to input line 705, the drain of transistor 701 and the source of PMOS transistor 707. The drain of PMOS transistor 702 is connected to the source of NMOS transistor 704, the gate of PMOS transistor 701 and the gate of NMOS transistor 703. The gate of PMOS transistor 702 is connected to the source of PMOS transistor 701, the drain of NMOS transistor 703, the gate of NMOS transistor 704 and the source of NMOS transistor 708.

The source of NMOS transistor 703 is connected to a source signal line 711. Source signal line carries a source signal that is generated by control circuitry. The drain of NMOS transistor 703 is connected to the source of PMOS transistor 701, the gate of PMOS transistor 702, the gate of NMOS transistor 704 and the source of NMOS transistor 708. The gate of NMOS transistor 703 is connected to the gate of PMOS transistor 701, the drain of PMOS transistor 702, the source of NMOS transistor 704, and the source of NMOS transistor 709.

NMOS transistor 704 has a drain connected to source signal line 711. The source of NMOS transistor 703 is connected to the drain of PMOS transistor 702, the gate of PMOS transistor 701 and the gate of NMOS transistor 703. The gate of PMOS transistor 702 is connected to the source of PMOS transistor 701, the drain of NMOS transistor 703, the gate of NMOS transistor 704 and the source of NMOS transistor 708.

PMOS transistor 707 has a source connected to the drain of PMOS transistor 701, the source of PMOS transistor 702 and input line 705. The gate of PMOS transistor 707 is connected to Erase line 712. Erase line carries an erase signal from the control circuitry when an erase operation is to be performed. The drain of PMOS transistor 707 is connected to the output 750 of column latch circuit 700.

NMOS transistor 708 has a source connected to the source of PMOS transistor 701, the drain of NMOS transistor 703 and the gates of PMOS transistor 702 and NMOS transistor 704. The drain of NMOS transistor is connected to the drain of PMOS transistor 707 and output 750. The gate of NMOS transistor 708 is connected to WTLD line 714.

NMOS transistor 709 has a drain connected to a VSS source. The source of NMOS transistor is connected to the drain of PMOS transistor 702, the source of NMOS transistor 704 and the gates of PMOS transistor 701 and NMOS transistor 703. The gate of NMOS transistor 709 is connected to a column reset line 712. Column reset line carries a reset signal when the memory cells of the column are to be reset.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. Circuitry that applies voltages to a memory to perform applications wherein said memory includes plurality of memory cells, said plurality of memory cells organized in rows and columns, said circuitry comprising:

First circuitry that applies one of a first plurality of voltages to at least one of said plurality of memory cells based upon a row in which said at least one of said plurality of memory cells is arranged and an application to be performed by said at least one of said plurality of memory cells said first circuitry including row latch circuitry having a first input that receives one of plurality of high voltages and a second input receives one of a plurality of low voltages and an output for selectively applying one of said one of said plurality of high voltages and said one of said plurality of low voltages to said at least one said plurality of memory cells; and Second circuitry that applies one of a second plurality of voltages to said at least one of said plurality of memory cells based upon a column in which said at least one of said plurality of memory cells is organized and said application to be performed by said at least one said plurality of memory cells.

2. The circuitry of claim 1 where in said first circuitry further comprises:

A high voltage multiplexor having a plurality of inputs that each receives one of said plurality of high voltages and an output for applying said one of said plurality of high voltages to said row latch circuitry.

3. The circuitry of claim 2 wherein one of said plurality of high voltages is a VCC voltage.

4. The circuitry of claim 3 wherein said VCC voltage is 2.5 volts.

5. The circuitry of claim 2 wherein one of said plurality of high voltages is VPP.

6. The circuitry of claim 5 where said VPP voltage is 15 volts.

7. The circuitry of claim 2 wherein one of said plurality of high voltages is VPP1.

8. The circuitry of claim 7 wherein said VPP1 voltage is 10 volts.

9. The circuitry of claim 1 further comprising:

a low voltage multiplexer having a plurality of inputs wherein each of said plurality of inputs receives one of said plurality of low voltages and an output that selectively applies said one of said plurality of low voltages to said row latch circuitry.

10. The circuitry of claim 9 wherein one of said plurality of low voltages is VSS.

11. The circuitry of claim 10 wherein said VSS voltage is 0 volts.

12. The circuitry of claim 9 wherein one said plurality of low voltages is VPP2.

13. The circuitry of claim 12 wherein said VPP2 voltage is 5 volts.

14. The circuitry of claim 1 further comprising:

Selection circuitry that applies a signal to said row latch circuitry to determine said one of said one of said plurality of high voltages and said one of said plurality of low voltages applied to said at least one of said plurality of memory cells.

15. The circuitry of 14 wherein said selection circuitry comprises:

a signal line;

an inverter connected to said signal line;

a world line multiplexor having a first input connected to said signal line and a second input connected to said inverter and an output that selectively applies one of said signal and an inverted signal to said row latch circuitry; and wherein said row latch circuit selectively applies said one of said one of said plurality of high voltages and said one of said plurality of low voltages to said at least one of said plurality of memory cells.

16. The circuitry of claim 1 wherein said second circuitry comprises:

column latch circuitry having a first input that receives a one of a plurality of high voltages and a second input that receives a one of a plurality of low voltages and an output that applies a one of said one of said plurality of high voltages and said one of said plurality of low voltages to said at least one of said plurality of memory cells.

17. The circuitry of claim 16 wherein said second circuitry further comprises:

word latch circuitry having a plurality of inputs for receiving said plurality of high voltages and an output for selectively applying said one of said plurality of high voltages to said column latch circuitry.

18. The circuitry of claim 17 wherein said second circuitry further comprises:

a first multiplexer having a plurality of inputs wherein each of said plurality of inputs receives a one of a first plurality of high voltages to said word latch, and having an output that applies one of said first plurality of high voltages to an input of said word latch circuitry.

19. The circuitry of claim 18 wherein said second circuitry further comprises:

a second multiplexer having a plurality of inputs wherein each of said plurality of inputs receives a one of a second plurality of high voltages to said word latch, and having an output that applies one of said second plurality of high voltages to an input of said word latch circuitry.

20. The circuitry of claim 17 wherein said word latch circuitry further comprises:

a set signal input that receives a set signal;

a reset signal input that receives an input signal; and circuitry that applies said one of said one of said plurality of high voltages and said one of said plurality of low voltages to said column latch circuitry.

21. The circuitry of claim 17 wherein one of said plurality of high voltages is VCC.

22. The circuitry of claim 21 wherein said VCC voltage is 2.5 volts.

23. The circuitry of claim 17 wherein one of said plurality of high voltages is VPP.

24. The circuitry of claim 23 wherein said VPP voltage is 15 volts.

25. The circuitry of claim 17 wherein one of said plurality of high voltages is VPP1.

26. The circuitry of claim 25 wherein said VPP1 voltage is 10 volts.

27. The circuitry of claim 16 further comprising:

a low voltage multiplexer having a plurality of input wherein each of said plurality of inputs receives one of said plurality of low voltage signals and having an output that selectively applies said one of plurality of low voltage signals to said column latch circuitry.

28. The circuitry of claim 27 wherein one of said plurality of low voltages is VSS.

29. The circuitry of claim 28 wherein said VSS voltage is 0 volts.

30. The circuitry of claim 27 wherein one of said plurality of low voltages is said low voltages VPP2.

31. The circuitry of claim 30 wherein said VPP2 voltage is 5 volts.

32. A method for applying voltages to a memory to perform applications wherein said memory includes plurality of memory cells, said plurality of memory cells organized in rows and columns, said method comprising:

applying one of a first plurality of voltages to at least one of said plurality of memory cells based upon a row in which said at least one of said plurality memory cells is arranged and an application to be performed by said at least one of said plurality of memory cells wherein said step of applying one of said first plurality of voltages comprises receiving one of plurality of high voltages, receiving one of a plurality of low voltages, selecting one of said one of said plurality of high voltage and said one of said plurality of low voltages, and applying said selected one of said voltages to said at least one of said plurality of memory cells; and applying a one of a second plurality of voltages to said at least one of a plurality of memory cells based upon a column in which said at least one of said plurality of memory cells is organized and said application to be performed by said at least one of said plurality of memory cells.

33. The method of claim 32 wherein said step of applying one of said first plurality of voltages further comprises:
receiving said plurality of high voltages; and
selecting said one of said plurality of high voltages.

34. The method of claim 33 wherein one of said plurality of high voltages is a VCC voltage.

35. The method of claim 34 wherein said VCC voltage is 2.5 volts.

36. The method of claim 33 wherein one of said plurality of high voltages is VPP.

37. The method of claim 36 where said VPP voltage is 15 volts.

38. The method of claim 33 wherein one of said plurality of high voltages is VPP1.

39. The method of claim 38 wherein said VPP1 voltage is 10 volts.

40. The method of claim 32 further comprising:
receiving said plurality of low voltages; and
selecting said one of said plurality of low voltages.

41. The method of claim 40 wherein one of said plurality of low voltages is VSS.

42. The method of claim 41 wherein said VSS voltage is 0 volts.

43. The method of claim 40 wherein one said plurality of low voltages is VPP2.

44. The method of claim 43 wherein said VPP2 voltage is 5 volts.

45. The method of claim 32 further comprising:
receiving a selection signal;
determining said one of said one of said plurality of high voltages and said one of said plurality of low voltages to apply to said at least one of said plurality of memory cells responsive to receiving said selection signal.

46. The method of claim 32 wherein said applying said one of said second plurality of voltages comprises:
receiving one of a plurality of high voltages;
receiving one of a plurality of low voltages;
selecting one of said one of said plurality of high voltages and said one of said plurality of low voltages; and
applying said selected one of said voltages to said at least one of said plurality of memory cells.

47. The method of claim 46 wherein said applying said one of said second plurality of voltages further comprises:
receiving said plurality of high voltages; and
determining said one of said plurality of high voltages.

48. The method of claim 47 further comprising:
receiving a set signal;
receiving a reset signal; and
determining said one of said one of said plurality of high voltages and said one of said plurality of low voltages responsive to receiving said set signal and said reset signal.

49. The method of claim 47 wherein one of said plurality of high voltages is VCC.

50. The method of claim 49 wherein said VCC voltage is 2.5 volts.

51. The method of claim 47 wherein one of said plurality of high voltages is VPP.

52. The method of claim 51 wherein said VPP voltage is 15 volts.

53. The method of claim 47 wherein one of said plurality of high voltages is VPP1.

54. The method of claim 53 wherein said VPP1 voltage is 10 volts.

55. The method of claim 46 further comprising:
receiving said plurality of low voltage signals; and
determining said one of plurality of low voltage signals.

56. The method of claim 55 wherein one of said plurality of low voltages is VSS.

57. The method of claim 56 wherein said VSS voltage is 0 volts.

58. The method of claim 55 wherein one of said plurality of low voltages is said low voltages is VPP2.

59. The method of claim 58 wherein said VPP2 voltage is 5 volts.

* * * * *